United States Patent
Goetz et al.

(10) Patent No.: US 6,630,692 B2
(45) Date of Patent: Oct. 7, 2003

(54) III-NITRIDE LIGHT EMITTING DEVICES WITH LOW DRIVING VOLTAGE

(75) Inventors: Werner Goetz, Palo Alto, CA (US); Nathan Fredrick Gardner, Mountain View, CA (US); Richard Scott Kern, San Jose, CA (US); Andrew Youngkyu Kim, Sam Jose, CA (US); Anneli Munkholm, Portolla Valley, CA (US); Stephen A. Stockman, Morgan Hill, CA (US); Christopher P. Kocot, Palo Alto, CA (US); Richard P. Schneider, Jr., Mountain View, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 0 days.

(21) Appl. No.: 09/870,330

(22) Filed: May 29, 2001

(65) Prior Publication Data

US 2002/0190259 A1 Dec. 19, 2002

(51) Int. Cl.$^7$ ................................................ H01L 33/00
(52) U.S. Cl. ........................ 257/94; 257/101; 257/102; 257/103
(58) Field of Search .......................... 257/94, 101, 102, 257/103

(56) References Cited

U.S. PATENT DOCUMENTS

| | | | |
|---|---|---|---|
| 5,602,418 A | * | 2/1997 | Imai et al. ................... 257/627 |
| 5,747,832 A | | 5/1998 | Nakamura et al. ........... 257/103 |
| 5,945,689 A | * | 8/1999 | Koike et al. ................... 257/88 |
| 6,005,258 A | | 12/1999 | Manabe et al. ................ 257/13 |
| 6,110,756 A | * | 8/2000 | Otsuka et al. ................. 438/41 |
| 6,172,382 B1 | * | 1/2001 | Nagahama et al. ............ 257/94 |
| 6,194,742 B1 | * | 2/2001 | Kern et al. ..................... 257/94 |
| 6,316,785 B1 | * | 11/2001 | Nunoue et al. ................ 257/14 |
| 6,388,275 B1 | * | 5/2002 | Kano ............................ 257/94 |

FOREIGN PATENT DOCUMENTS

| | | | |
|---|---|---|---|
| JP | 2001102690 A | * | 4/2001 |
| WO | WO 01/4224 A2 | | 6/2001 |

OTHER PUBLICATIONS

Motoaki Iwaya et al., "Reduction of Etch Pit Density in Organometallic Vapor Phase Epitaxy–Grown GaN on Sapphire by Insertion of a Low–Temperature–Deposited Buffer Layer between High–Temperature–Grown GaN", Japanese Journal of Applied Physics, vol. 37 (1998) Part 2, No. 3B, pp.

(List continued on next page.)

Primary Examiner—Nathan J. Flynn
Assistant Examiner—Remmon R. Fordé
(74) Attorney, Agent, or Firm—Patent Law Group LLP

(57) ABSTRACT

III-Nitride light emitting diodes having improved performance are provided. In one embodiment, a light emitting device includes a substrate, a nucleation layer disposed on the substrate, a defect reduction structure disposed above the nucleation layer, and an n-type III-Nitride semiconductor layer disposed above the defect reduction structure. The n-type layer has, for example, a thickness greater than about one micron and a silicon dopant concentration greater than or equal to about $10^{19}$ cm$^{-3}$. In another embodiment, a light emitting device includes a III-Nitride semiconductor active region that includes at least one barrier layer either uniformly doped with an impurity or doped with an impurity having a concentration graded in a direction substantially perpendicular to the active region.

28 Claims, 8 Drawing Sheets

OTHER PUBLICATIONS

Wei Zhang et al., "Time–Modulated Growth of Thick GaN by Hydride Vapor Phase Epitaxy: Suppression of Dislocation", Proc. Int. Workshop on Nitride Semiconductors, IPAP Conf. Series 1, pp. 27–29.

Shuji Nakamura, et al., "Si–and Ge–Doped GaN Films Grown with GaN Buffer Layers", Japanese Journal of Applied Physics, vol. 31 (1992), Part 1, No. 9A, pp. 2883–2888.

Hiroshi Murakami et al., "Growth of Si–Doped $Al_xGa_{1-x}N$ on (0001) Sapphire Substrate by Metalorganic Vapor Phase Epitaxy", Journal of Crystal Growth 115 (1991) North–Holland, pp. 648–651.

J. Han et al., "The Effect of $H_2$ on Morphology Evolution During GaN Metalorganic Chemical Vapor Deposition", Appl. Phys. Lett. 71 (21), Nov. 24, 1997, pp. 3114–3116.

Kenji Uchida et al., "Morphological Evolution of the InGaN–Based Quantum Well Surface Due to a Reduced Density of Threading Dislocations in the Underlying GaN Through Higher Growth Pressure", Jpn. J. Appl. Phys., vol. 39 (2000), Part 1, No. 4A, pp. 1635–1641.

Satoru Tanaka et a., "Anti–Surfactant in III–Nitride Epitaxy—Quantum Dot Formation and Dislocation Termination–", Jpn. J. Appl. Phys., vol; 39 (2000), Part 2, No. 8B, Aug. 15, 2000, pp. L831–L834.

S. Keller et al., "Dislocation Reduction in GaN Films Through Selective Island Growth on InGaN", Applied Physics Letters, vol. 77, No. 17, Oct. 23, 2000, pp. 2665–2667.

Abstract of Japanese Patent No. JP10004210, Watanabe Hiroshi et al., 2 pages, downloaded from http://www.micropat.com/cgi–bin/patentlist.

Abstract of Japanese Patent No. JP2000340892, Kuramoto Masaru, 2 pages, downloaded from http://www.micropat.com/cgi–bin/patentlist.

Abstract of Japanese Patent No. JP2000196144, Yoshie Mutsuyuki, 2 pages, downloaded from http://www.micropat.com/cgi–bin/patentlist.

Abstract of Japanese Patent No. JP11233824, Asai Makoto et al., 2 pages, downloaded from http://www.micropat.com/cgi–bin/patentlist.

Abstract of Japanese Patent No. JP2000068594, Marui Hiromitsu et al., 2 pages downloaded from http://www.micropat.com/cgi–bin/patentlist.

Abstract of Japanese Patent No. JP2000036619, Kamimura Toshiya, 2 pages, downloaded from http://www.micropat.com/cgi–bin/patentlist.

* cited by examiner

III-NITRIDE LIGHT EMITTING DEVICES WITH LOW DRIVING VOLTAGE

FIELD OF THE INVENTION

The present invention relates to semiconductor light emitting devices and more particularly to III-Nitride light emitting devices.

BACKGROUND

III-Nitride semiconductors are an important class of III–V compound semiconductors. III-Nitride light emitting devices are based on semiconducting alloys of nitrogen with elements from group III of the periodic table. Examples of such III-Nitride devices include $In_xAl_yGa_{1-x-y}N$ ($0 \leq x \leq 1$, $0 \leq y \leq 1, x+y \leq 1$) based light emitting diodes (LEDs) and laser diodes (LDs). Such III-Nitride light emitting devices are commercially valuable high brightness sources of, for example, ultraviolet, blue, and green light.

The wall plug efficiency of a light emitting device is the ratio of optical power coupled out of the device to the electrical power supplied to the device. A high wall plug efficiency is generally advantageous. The wall plug efficiency of an LED or LD is inversely proportional to the driving (forward) voltage $V_f$ that must be applied to the device for it to emit light when driven at the desired current $I_f$. The theoretical lower limit for $V_f$ is determined by the energy of the photons emitted by the device. Unfortunately, the driving voltage of conventional III-Nitride light emitting devices is typically much higher than this lower limit.

The high driving voltage of conventional III-Nitride light emitting devices results in part from high series resistance in the n-type III-Nitride device layers. Potential energy barriers (n-contact barriers) at the interface of n-type semiconductor device layers with (typically metal) electrical contacts also contribute to these high driving voltages.

The series resistance in n-type III-Nitride layers and n-contact barriers associated with those layers can be reduced by increasing the doping density of electron donor impurities, typically Si atoms, in the III-Nitride layer. For planar devices, the series resistance can also be decreased by increasing the thickness of the n-type III-Nitride layers. However, incorporation of Si atoms into a III-Nitride layer generates in-plane tensile strain in the layer. At a sufficiently high Si doping density, the tensile strain cracks the III-Nitride layer and may thus render it unusable as a light emitting device. The Si doping density at which cracking of a III-Nitride layer occurs decreases as the layer is made thicker.

FIG. 1A illustrates relationships between Si doping density, III-Nitride layer thickness, and cracking. Combinations of Si doping concentration and layer thickness form regions where transitions from uncracked to cracked layers occur. Line 1 indicates combinations of Si doping density and GaN layer thickness at a transition between cracked and uncracked GaN layers prepared by a conventional "two-step" growth process in which the GaN layer is grown directly on a low-temperature nucleation layer by metal-organic chemical vapor deposition (MOCVD). GaN layers prepared by this conventional process and having silicon doping and thickness combinations above line 1 typically crack. For example, for a 1 micron ($\mu$m) thick GaN layer, the Si doping concentration is limited by cracking to below $1 \times 10^{19}$ per centimeter cubed ($cm^{-3}$) for a GaN layer prepared by the conventional two-step method. Either increasing the Si doping concentration or increasing the thickness of the layer will cause the layer to crack.

Such doping/thickness limitations are typically observed for conventional two-step growth of Si doped GaN layers by the inventors and others. (Data point 3 is from Murakami et al., J. Crystal Growth 115 (1991) 648–651.) However, the formation of uncracked, 4 $\mu$m thick GaN layers with a Si doping concentration of ~$2 \times 10^{19}$ cm$^{-3}$ directly on a low-temperature nucleation layer has been reported by S. Nakamura et al., Japanese Journal of Applied Physics 31,2883–2888 (1992). Nakamura et al. concluded that their use of an unconventional two-flow MOCVD reactor enabled them to produce the crack-free GaN layers with high Si concentration. In this two-flow reactor an additional vertical subflow of inert gas is combined with a horizontally injected source gases. Such unconventional reactors are not generally available.

The high driving voltages of conventional III-Nitride light emitting devices also result, in part, from the piezoelectric nature of the III-Nitride crystal structures. The active regions of III-Nitride light emitting devices typically include one or more quantum well layers and one or more barrier layers. These layers typically have compositions that differ from each other and differ from the surrounding layers in the device. Consequently, these layers are typically strained. As a result of this strain and of the piezoelectric nature of the III-Nitride crystal structure, the regions near the interfaces of quantum well layers and barrier layers in the active regions of III-Nitride light emitting devices experience piezoelectric fields. These piezoelectric fields, combined with heterojunction band offsets, produce interface energy barriers that impede the transport of electrons and holes into the active region and increase the driving voltage of the light emitting device.

What is needed is a III-Nitride light emitting device that overcomes the above drawbacks of conventional III-Nitride devices.

SUMMARY

Light emitting devices having improved performance are provided. In one embodiment, a light emitting device includes a substrate, a nucleation layer disposed on the substrate, a defect reduction structure disposed above the nucleation layer, and an n-type III-Nitride semiconductor layer disposed above the defect reduction structure. The n-type layer has, for example, a thickness greater than or equal to about one micron and a silicon dopant concentration greater than or equal to about $10^{19}$ cm$^{-3}$.

In one implementation the defect reduction structure includes a defect reduction layer. The defect reduction layer may reduce the defect density in the n-type layer to about $2 \times 10^9$ cm$^{-2}$ or less and increase compressive strain in the n-type III-Nitride semiconductor layer so that the a-lattice parameter is less than 3.187 Angstroms (Å). The defect reduction layer may be formed, for example, from source gases including $NH_3$, trimethylgallium, and $H_2$ with the ratio of the partial pressure of $NH_3$ to the partial pressure of trimethylgallium about 200 to about 1500 and the ratio of the partial pressure of $NH_3$ to the partial pressure of $H_2$ about 0.05 to about 0.35.

In another implementation the defect reduction structure includes a III-Nitride semiconductor layer on which is disposed a silicon containing material. In another implementation the defect reduction structure includes one or more nucleation layers. In another implementation a growth surface of the defect reduction structure is roughened prior to growth of the n-type layer. Such a rough growth surface may be produced, for example, by interrupting growth of a III-Nitride layer and exposing it to an etching environment for about 1 to about 1000 seconds.

In some implementations, barrier layers in the active region of the light emitting device are doped with acceptor and/or donor impurities. The concentration profiles of the impurities may be either spatially uniform or spatially non-uniform.

In another embodiment, a light emitting device includes an active region that includes at least one barrier layer either uniformly doped with an impurity or doped with an impurity having a concentration graded in a direction substantially perpendicular to the active region. The concentration of the impurity may be graded to at least partially cancel an effect of a piezoelectric field in the active region.

Light emitting devices in accordance with embodiments of the present invention may exhibit advantageously low series resistance, n-contact barrier, and driving voltage. Advantageously, light emitting devices in accordance with embodiments of the present invention may be fabricated, for example, in conventional unidirectional-flow MOCVD reactors.

BRIEF DESCRIPTION OF THE DRAWINGS

It should be noted that the dimensions in the various figures are not necessarily to scale. Like reference numbers in the various figures denote like parts in the various embodiments.

DETAILED DESCRIPTION

Figure 1A:
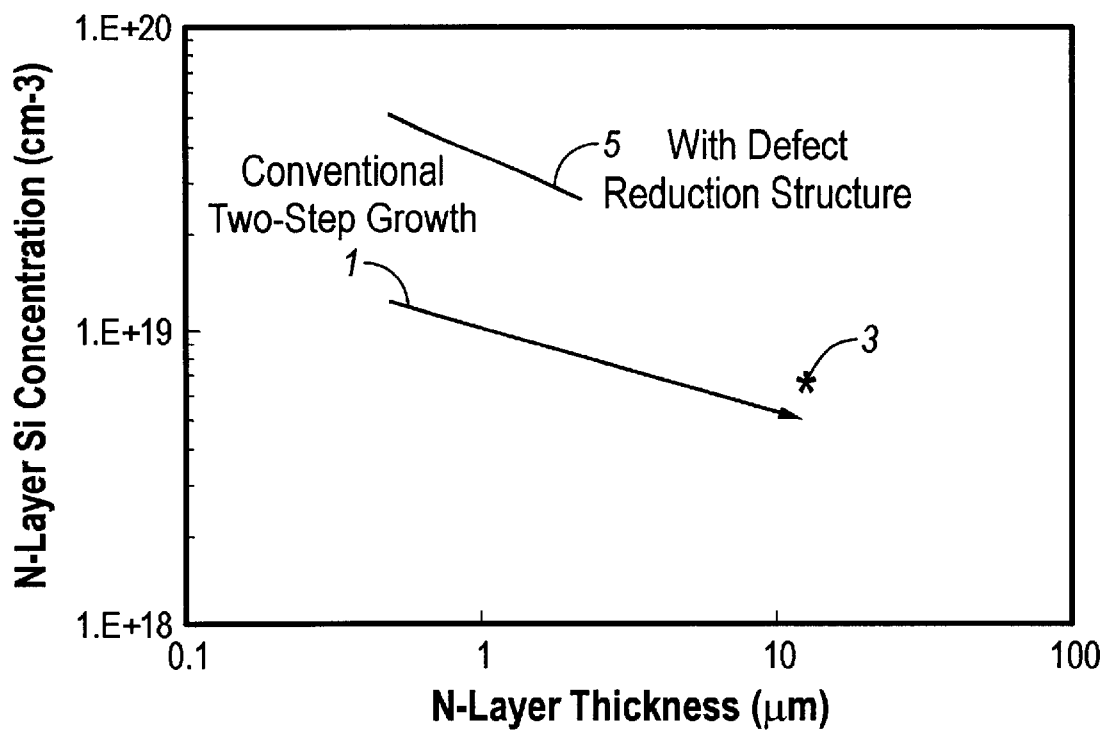
FIG. 1A is a plot illustrating combinations of GaN layer thickness and Si concentration that result in cracked and uncracked layers.

Numerous defect reduction structures are known which reduce the concentration of extended structural defects (primarily threading dislocations) in III-Nitride semiconductor devices. Such defect reduction structures, which typically include one or more III-Nitride layers, are typically grown above a conventional low-temperature nucleation layer grown on a substrate. III-Nitride semiconductor layers grown above such defect reduction structures typically have a lower dislocation density than do III-Nitride semiconductor layers conventionally grown directly on a conventional low-temperature nucleation layer.

The inventors have recognized that such defect reduction structures increase the in-plane compressive strain in III-Nitride layers grown above them. The inventors have also recognized that the increased compressive strain induced by such defect reduction structures allows III-Nitride semiconductor layers grown above them to be doped with silicon at high concentrations without cracking. In particular, the inventors have recognized that high quality III-Nitride semiconductor layers can be grown above such defect reduction structures with thicknesses and silicon concentrations higher than achievable in III-Nitride semiconductor layers grown in conventional single-flow MOCVD reactors directly on a conventional nucleation layer grown on a substrate. The inventors believe that they are the first to recognize the effect of defect reduction structures on the achievable silicon doping concentrations in crack-free III-Nitride semiconductor layers.

In accordance with embodiments of the present invention, a III-Nitride nucleation layer (such as a layer of GaN, InN, AlN, InGaN, AlGaN or any composition of AlInGaN) is grown at low-temperature on a substrate. The substrate is, for example, a sapphire substrate, a silicon carbide substrate, or a silicon substrate. In embodiments including SiC substrates, the nucleation layer is typically grown at a higher temperature. Substrate surfaces may be parallel to or misoriented with respect to a main crystal plane of the substrate. A defect reduction structure is grown above the nucleation layer. One or more III-Nitride semiconductor layers are grown above the defect reduction structure. At least one of the III-Nitride layers grown above the defect reduction layer is an n-type layer highly doped with silicon.

In some embodiments, the defect reduction structure and the highly silicon doped n-type III-Nitride semiconductor layer or layers are included in a III-Nitride light emitting device such as an LED or an LD that operates at an advantageously low driving voltage due to high Si doping and a thick n-type layer. The III-Nitride n-type layer may be, for example, a GaN layer about 2 microns thick and doped with Si to a concentration of about $1 \times 10^{19}$ cm$^{-3}$. Such device structures are typically crack-free. Raising the Si doping level of the n-type layer above about $3 \times 10^{19}$ cm$^{-3}$ typically leads to roughening of the surface of the n-type layer before cracking.

Embodiments including four types of defect reduction structure are described. The present invention is not limited to these embodiments, however. Other substrates, other nucleation layers, and other defect reduction structures may also be used. Preferably, a defect reduction structure included in an embodiment of the present invention allows the growth above the defect reduction structure of III-Nitride layers having threading dislocation densities of less than about $2 \times 10^9$ cm$^{-2}$. Threading dislocations are characterized in that they penetrate through the crystal substantially in the growth direction. These dislocations can have edge, screw, or mixed character. It is characteristic of these defect reduction structures that they can be incorporated "in-situ" during growth.

The various III-Nitride semiconductor layers in the embodiments described below are grown by MOCVD in a conventional unidirectional flow MOCVD reactor using trimethylgallium (TMG) or triethylgallium (TEG) as a gallium source, trimethylaluminum (TMAl) as an aluminum source, trimethylindium (TMIn) as an indium source, ammonia ($NH_3$) as a nitrogen source, silane ($SiH_4$) as a silicon source, and hydrogen ($H_2$) or nitrogen ($N_2$) as a carrier gas. However, other MOCVD reactors, other source and carrier gases, and other growth methods, such as molecular beam epitaxy (MBE) or hydride vapor phase epitaxy (HVPE), for example, may also be used.

Figure 2:
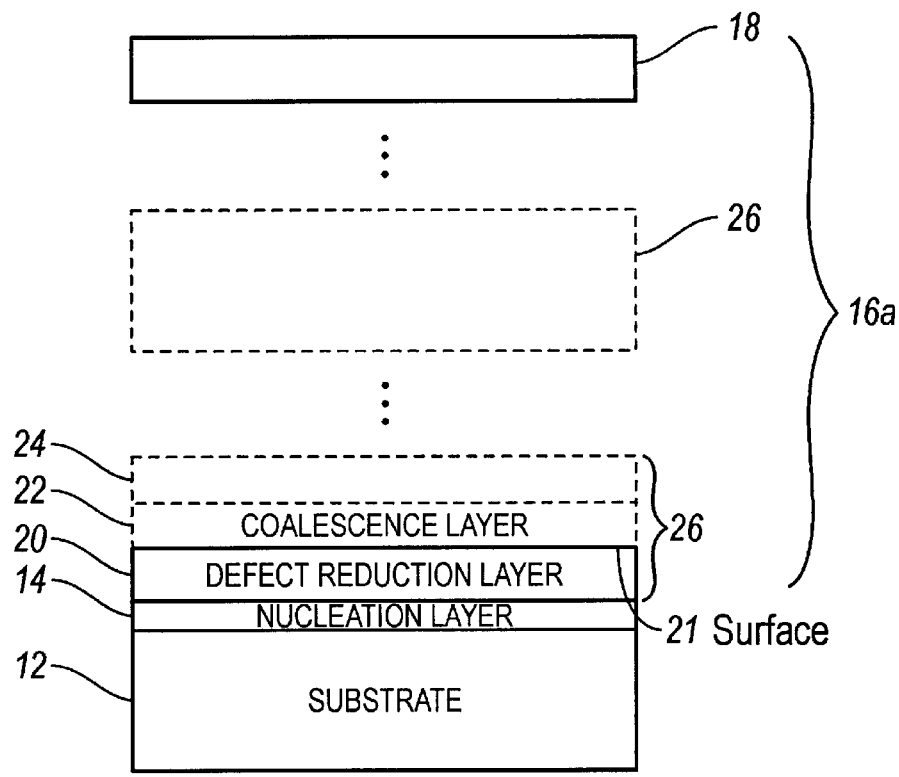
FIG. 2 schematically illustrates the use of a defect reduction structure including a defect reduction layer in accordance with an embodiment of the present invention.

Referring to FIG. 2, in one embodiment a low-temperature III-Nitride nucleation layer 14 having a thickness of about 200 Å to about 500 Å, typically about 250 Å, is grown on a sapphire substrate 12 at a temperature of about 500° C. to about 600° C., typically about 550° C. Subsequently, a defect reduction structure 16a is grown above nucleation layer 14 and a high temperature III-Nitride layer 18 is grown above defect reduction structure 16a.

Defect reduction structure 16a includes GaN defect reduction layer 20 grown on nucleation layer 14 at a temperature of about 950° C. to about 1150° C., typically about 1050° C. The ratios of partial pressures $NH_3$/TMG and $NH_3/H_2$ (more generally, V/III and V/$H_2$, where V and III designate elements from groups V and III of the periodic table) during growth of defect reduction layer 20 are low compared to those required to maintain a smooth growth surface morphology. Ranges and typical values for these partial pressure ratios during growth of GaN defect reduction layer 20 are tabulated in row (a) of Table 1 below. Defect reduction layer 20 is grown under these conditions to a thickness of about 0.1 μm to about 1 μm, typically about 0.5 μm. The flow of TMG may then be stopped and defect reduction layer 20 may be exposed to the continuing hydrogen and ammonia flows for about 1 second to about 1000 seconds, typically about one minute. The $H_2$ and $NH_3$ ambient etches the surface of defect reduction layer 20. These growth and etching conditions promote the formation of a rough surface 21 including individual independent GaN grains or islands typically having a diameter of about 0.1 μm to about 1 μm.

In some implementations an optional GaN coalescence layer 22 (indicated by a dashed-line box) is grown on defect reduction layer 20 at a temperature of about 950° C. to about 1150° C., typically about 1050° C. The growth temperature and the ratio of partial pressures $NH_3$/TMG and $NH_3/H_2$ are selected to promote rapid lateral (parallel to the substrate surface) growth and to lead to coalescence of the GaN grains and formation of a smooth epitaxial growth surface. Ranges and typical values for these partial pressure ratios during growth of GaN coalescence layer 22 are tabulated in row (b) of Table 1 below. Coalescence layer 22 has a thickness of, for example, about 0.5 μm to about 2 μm, typically about 1 μm. In some implementations coalescence layer 22 is doped with silicon to a concentration of, for example, about $1 \times 10^{18}$ cm$^{-3}$.

In some implementations an optional high-temperature (standard) GaN layer 24 (also indicated by a dashed-line box) is grown on coalescence layer 22, if present, or on defect reduction layer 20. GaN layer 24 is grown at a temperature of about 950° C. to about 1150° C., typically about 1050° C. Ranges and typical values for the partial pressure ratios $NH_3$/TMG and $NH_3/H_2$ during growth of standard GaN layer 24 are tabulated in row (c) of Table 1 below. These growth conditions are selected to promote a smooth growth surface morphology and a high growth rate. GaN layer 24 has a thickness of, for example, about 0.1 μm to about 10 μm, typically about 2 μm. In some implementations layer 24 is either undoped or doped n-type with silicon to a concentration of, for example, about $1 \times 10^{18}$ cm$^{-3}$ or higher.

Sequence 26 including defect reduction layer 20, optional coalescence layer 22 and optional high temperature GaN layer 24 may be repeated multiple times in defect reduction structure 16a to further reduce the defect density and increase the room temperature compressive strain in III-Nitride layer 18. Such optional repetition of sequence 26 is indicated in FIG. 2 by the dashed line box labeled 26 and the ellipses above and below it.

TABLE 1

| | Partial Pressure Ratios | | | |
|---|---|---|---|---|
| | $NH_3$/TMG | | $NH_3/H_2$ | |
| Layer | Typical | Range | Typical | Range |
| a) Defect Reduction | 510 | 200–1500 | 0.13 | 0.05–0.35 |
| b) Coalescence | 2200 | 1000–4000* | 0.5 | 0.4–0.85 |
| c) Standard | 1680 | 800–4000* | 0.5 | 0.35–0.85 |

*Practical limitation due to slow growth rate.

Due to the presence of defect reduction structure 16a, III-Nitride layers 18 and 24 and III-Nitride layers grown above them (not shown) typically have a dislocation density less than about $2 \times 10^9$ cm$^{-2}$ and may be highly doped with silicon without cracking. Referring again to FIG. 1A, for example, line 5 indicates combinations of Si doping density and GaN layer thickness at a transition between cracked and uncracked GaN layers grown above a defect reduction structure in accordance with an embodiment of the present invention. Such GaN layers having silicon doping and thickness combinations below line 5 are typically crack-free.

Figure 1B:
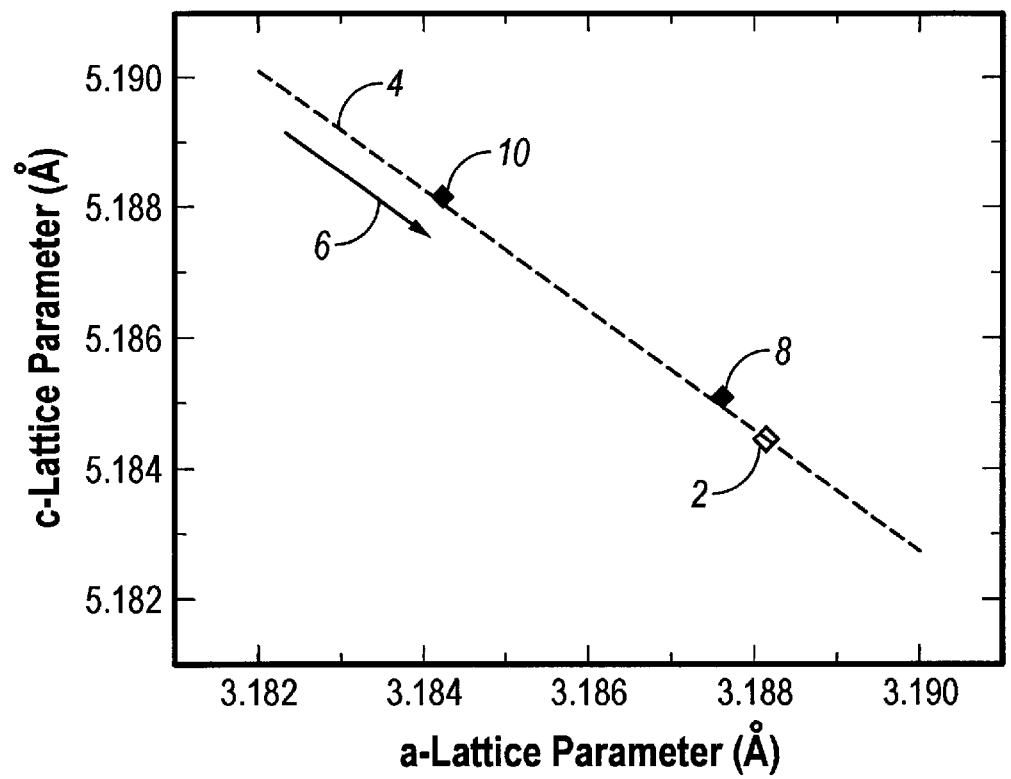
FIG. 1B is a plot of lattice parameters for silicon doped and undoped GaN layers.

III-Nitride semiconductor layers are typically grown with a Wurtzite crystal structure having a c-axis substantially perpendicular to the substrate surface and a-axes perpendicular to the c-axis and substantially in the plane of the layer (which is thus approximately a c-plane). FIG. 1B also illustrates the silicon doped III-Nitride cracking phenomenon in a plot of the c-lattice constant versus the a-lattice constant for example silicon doped and undoped GaN layers at room temperature. Data point 2 indicates the lattice constants of an unstrained homoepitaxial GaN layer (a=3.1878 Angstroms, c=5.1850 Angstroms). The lattice parameters of undoped and silicon doped GaN layers grown at high temperature (e.g., 1050° C.) by metal-organic chemical vapor deposition (MOCVD) above a sapphire substrate typically lie along dashed line 4. Increasing a-lattice constant and decreasing c-lattice constant, relative to data point 2, indicate tensile in-plane strain. Undoped GaN layers grown above a sapphire substrate exhibit in-plane compressive strain at room temperature and thus lie along dashed line 4 above and to the left of data point 2. Adding silicon to a GaN layer increases its in-plane tensile strain and thus moves it along dashed line 4 in the direction of arrow 6. Silicon doped GaN layers lying along dashed line 4 near or below and to the right of data point 2 exhibit cracks.

The lattice parameters of an example conventionally grown GaN layer having a thickness of about 2 μm and a Si doping density of about $5\times10^{18}$ cm$^{-3}$ are indicated by data point 8 in FIG. 1B. For comparison, data point 10 indicates the lattice parameters of an example III-Nitride layer 18 of n-type GaN having a thickness of about 2 μm and a silicon doping concentration of about $1\times10^{19}$ cm$^{-3}$. Data point 10 is above and to the left of data point 8, indicating that the example III-Nitride layer 18 is much less prone to cracking than the conventional GaN layer represented by data point 8. Typically, GaN layers grown above defect reduction structures have a-lattice parameters less than or equal to 3.187 Å.

In some implementations III-Nitride layer 18 is a silicon doped n-type GaN layer grown on defect reduction structure 16a at a temperature of about 950° C. to about 1150° C., typically about 1050° C. Ranges and typical values for the partial pressure ratios NH$_3$/TMG and NH$_3$/H$_2$ during growth of such a GaN layer 18 are substantially the same as those for standard GaN layer 24 tabulated in row (c) of Table 1. These growth conditions are selected to promote a smooth growth surface morphology. The thickness of III-Nitride layer 18 in such implementations is, for example, about 0.5 μm to about 10 μm, typically about 2 μm. The silicon concentration in III-Nitride layer 18 in such implementations is typically about $1\times10^{19}$ cm$^{-3}$ or higher.

In other implementations III-Nitride layer 18 includes other group III and/or group V elements in addition to or instead of gallium and nitrogen. In such implementations III-Nitride layer 18 may have thicknesses and high silicon doping concentrations similar to those described above for implementations in which layer 18 is a highly silicon doped GaN layer. In some implementations, III-Nitride layer 18 is not highly doped with silicon, but III-Nitride layers grown above it have thicknesses and high silicon doping concentrations similar to those described above.

Although in the above examples layers 20, 22, and 24 in defect reduction structure 16a are formed from GaN, in other implementations these layers may be formed from other III-Nitride materials such as, for example, InGaN, AlGaN, AlInGaN, AlInGaNAs, AlInGaNP, or combinations thereof. Layers grown from such other III-Nitride materials will have lattice parameters different from those shown in FIG. 1B for GaN. Growth conditions for defect reduction structures similar to defect reduction structure 16a are described in J. Han et al., Applied Physics Letters 71 (21), 3114 (1997), incorporated herein by reference in its entirety.

Figure 3:
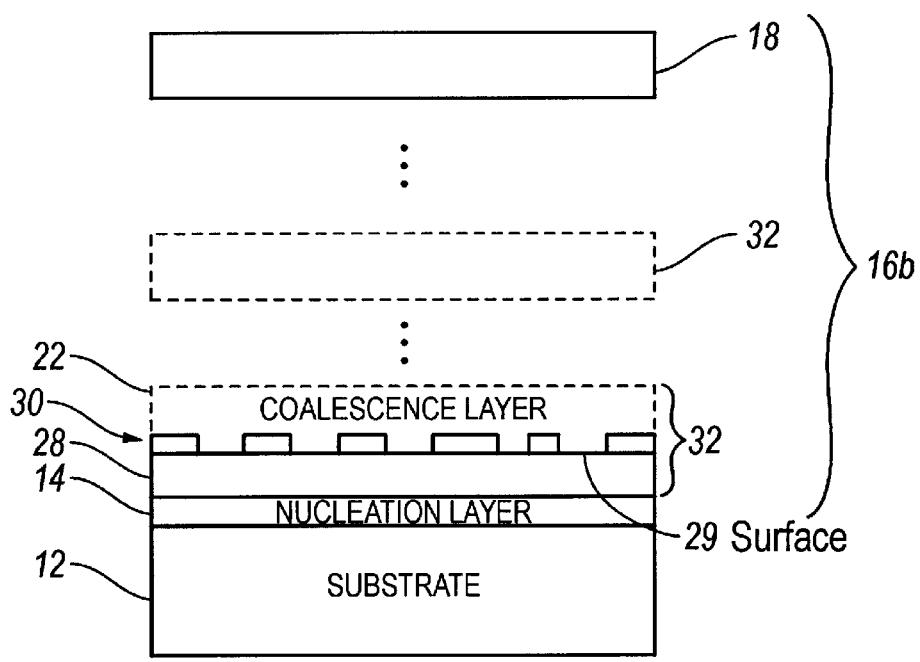
FIG. 3 schematically illustrates the use of a defect reduction structure including micro-masks in accordance with another embodiment of the present invention.

Referring to FIG. 3, in another embodiment defect reduction structure 16b replaces defect reduction structure 16a of FIG. 2. Substrate 12, nucleation layer 14, and III-Nitride layer 18 are substantially the same as in the previous embodiment.

Defect reduction structure 16b includes high-temperature GaN layer 28 grown on nucleation layer 14 at a temperature of about 950° C. to about 1150° C., typically about 1050° C. Ranges and typical values for the partial pressure ratios NH$_3$/TMG and NH$_3$/H$_2$ during growth of such a GaN layer 28 may be substantially the same as those for standard GaN layer 24 or coalescence layer 22 tabulated in rows (b) and (c) of Table 1. These growth conditions are selected to promote a smooth growth surface morphology. In some implementations layer 28 is doped n-type with silicon to a concentration of, for example, about $1\times10^{18}$ cm$^{-3}$ or higher.

Layer 28 is grown to a thickness of, for example, about 0.1 μm to about 10 μm, typically about 1 μm. The flow of TMG is then stopped and layer 28 is exposed to SiH$_4$ or Si$_2$H$_6$ to deposit about 0.1 monolayers to about 1.5 monolayers, typically about one monolayer, of silicon onto surface 29 of layer 28. The deposited silicon is believed to react with nitrogen in layer 28 to form micro masks (islands) 30 which cover portions of surface 29. When III-Nitride growth is subsequently reinitiated on surface 29, III-Nitride material nucleates on uncovered portions of surface 29, grows vertically, and then grows laterally over masks 30 to form a low defect density layer.

In some implementations an optional coalescence layer 22 is grown over masks 30 under conditions substantially similar to those described in the previous embodiment (FIG. 2). Sequence 32 including high-temperature GaN layer 28, masks 30, and optional coalescence layer 22 may be repeated multiple times in defect reduction structure 16b to further reduce the defect density and increase the compressive strain in III-Nitride layer 18.

Although in this example layers 28 and 22 in defect reduction structure 16b are formed from GaN, in other implementations these layers may be formed from other III-Nitride materials such as, for example, InGaN, AlGaN, AlInGaN, AlInGaNAs, AlInGaNP, or combinations thereof. Furthermore, the Si source may be disilane (Si$_2$H$_6$) or other Si containing compounds. Defect reduction structures similar to defect reduction structure 16b are described in S. Tanaka et al., Japanese Journal of Applied Physics 39, L831 (2000), incorporated herein by reference in its entirety. Micro masking techniques such as used in this embodiment may be referred to as "silicon dosing" or anti-surfactant methods in the art.

Figure 4:
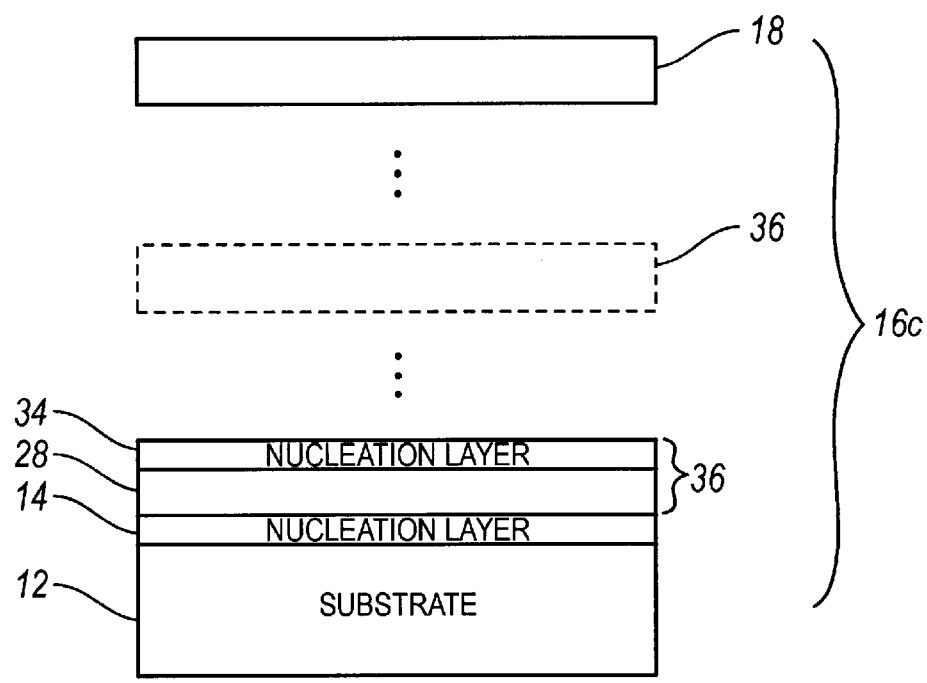
FIG. 4 schematically illustrates the use of a defect reduction structure including multiple nucleation layers in accordance with another embodiment of the present invention.

Referring to FIG. 4, another embodiment includes defect reduction structure 16c. Substrate 12, nucleation layer 14, high-temperature GaN layer 28, and III-Nitride layer 18 are substantially the same as in the previous embodiment.

Defect reduction structure 16c includes low-temperature GaN nucleation layer 34 grown on high-temperature GaN layer 28. Nucleation layer 34 is, for example, grown under conditions substantially similar to those used in the growth of nucleation layer 14 and grown to a similar thickness. Such use of multiple nucleation layers reduces the defect density and increases the compressive strain of subsequently grown III-Nitride layers. Consequently, sequence 36 including high-temperature GaN layer 28 and low-temperature nucleation layer 34 may be repeated multiple times in defect reduction structure 16c.

Although in this example layer 28 is formed from GaN, in other implementations layer 28 in defect reduction structure 16c may be formed from other III-Nitride materials. Defect reduction structures including multiple nucleation layers as in defect reduction structure 16c are described in M. Iwaya et al., Japanese Journal of Applied Physics 37, 316 (1998), incorporated herein by reference in its entirety.

Figure 5:
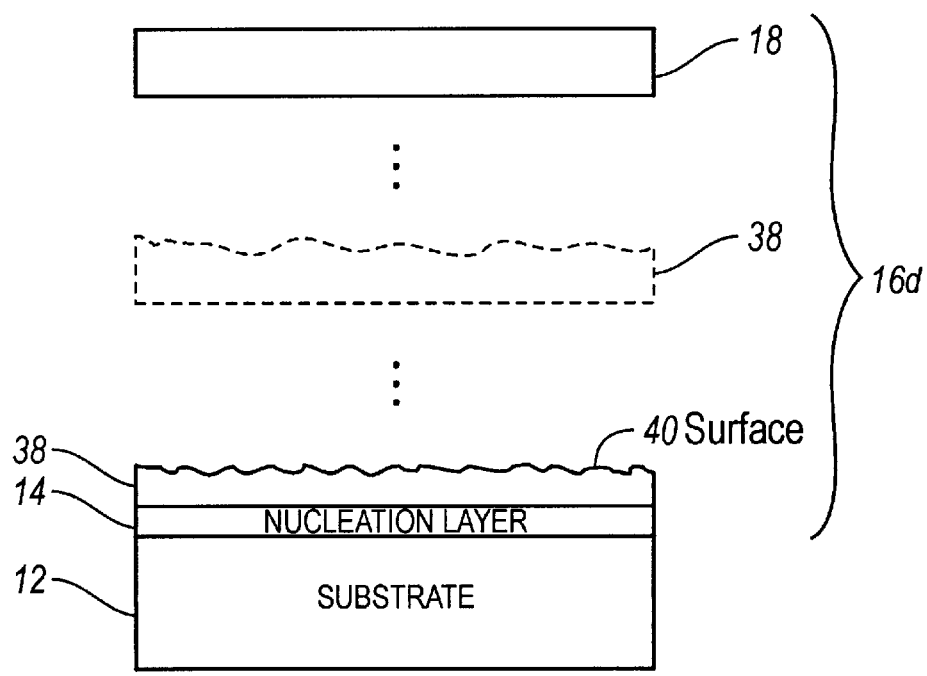
FIG. 5 schematically illustrates the use of a defect reduction structure including III-Nitride layers having roughened surfaces in accordance with another embodiment of the present invention.

Referring to FIG. 5, another embodiment includes defect reduction structure 16d. Substrate 12, nucleation layer 14, and III-Nitride layer 18 are substantially the same as in the previous embodiments.

Defect reduction structure 16d includes GaN layer 38 grown on nucleation layer 14 at a temperature of about 950° C. to about 1150° C., typically about 1050° C. Ranges and typical values for the partial pressure ratios NH$_3$/TMG and NH$_3$/H$_2$ during growth of such a GaN layer 38 may be substantially the same as those for standard GaN layer 24 or coalescence layer 22 tabulated in rows (b) and (c) of Table 1. Layer 38 is grown to a thickness of about 0.1 μm to about 10 μm, typically about 1 μm. The flow of TMG (more generally, of group III elements) is then stopped and the ratio of the partial pressure of NH$_3$ to that of H$_2$ is reduced to between about 0.05 and about 0.35, typically about 0.15, for about 1 second to about 1000 seconds, typically about one minute. The H$_2$ and NH$_3$ ambient etches and roughens surface 40 of layer 38. Reinitiation of III-Nitride material growth on surface 40 leads to renewed nucleation, defect reduction, and increased compressive strain in subsequently grown III-Nitride layers. Growth of a roughened III-Nitride layer such as layer 38 may be repeated multiple times in defect reduction structure 16*d* to further reduce the defect density and increase the compressive strain in subsequently grown III-Nitride layers.

Although in this example layer 38 is formed from GaN, in other implementations layer 38 in defect reduction structure 16*d* may be formed from other III-Nitride materials such as, for example, InGaN, AlGaN, AlInGaN, AlInGaNAs, AlInGaNP, or combinations thereof. Defect reduction structures that include III-Nitride layers roughened by etching during growth pauses as in defect reduction structure 16*d* are described in W. Zhang et al., Proc. Int. Workshop on Nitride Semiconductors IPAP Conf. Series 1, 27–29, incorporated herein by reference in its entirety.

Other embodiments include a defect reduction structure including combinations of, for example, the defect reduction layers, multiple nucleation layers, roughened surfaces, and Si dosed surfaces described with respect to defect reduction structures 16*a*–16*d*.

An example LED 42 (FIG. 6) in accordance with an embodiment of the present invention includes a low-temperature nucleation layer 14 grown on a substrate 12, and a defect reduction structure 16 grown on nucleation layer 14. Defect reduction structure 16 may be, for example, any one of defect reduction structures 16*a*–16*d* described above. III-Nitride active region 44 is disposed between upper p-type III-Nitride region 46 and lower III-Nitride region 48. Active region 44 typically includes one or more quantum well layers and one or more barrier layers.

Lower III-Nitride region 48 includes III-Nitride layer 18, described above, grown on defect reduction structure 16. III-Nitride region 48 may also optionally include one or more additional III-Nitride layers grown above layer 18, such as layers 50 and 52. These additional layers may be, for example, confinement, cladding, or contact layers. At least one of the layers in lower III-Nitride region 48 is an n-type III-Nitride layer having a silicon concentration greater than or equal to about $1\times10^{19}$ cm$^{-3}$. Such a highly silicon doped layer has a thickness of, for example, about 1 µm to about 10 µm, typically about 2 µm.

Ohmic p-contact 54 and metallic layer 56 are electrically coupled to each other and to upper III-Nitride region 46. Ohmic n-contact 58 is electrically coupled to lower III-Nitride region 48. Application of a suitable forward bias across contacts 54 and 58 results in emission of light from active region 44. Metallic layer 56 may be semitransparent to light emitted by active region 44. Alternatively, metallic layer 56 may be highly reflective to light emitted by active region 44, and LED 42 may be mounted as a flip-chip with contacts 54 and 56 facing a submount.

Figure 6:
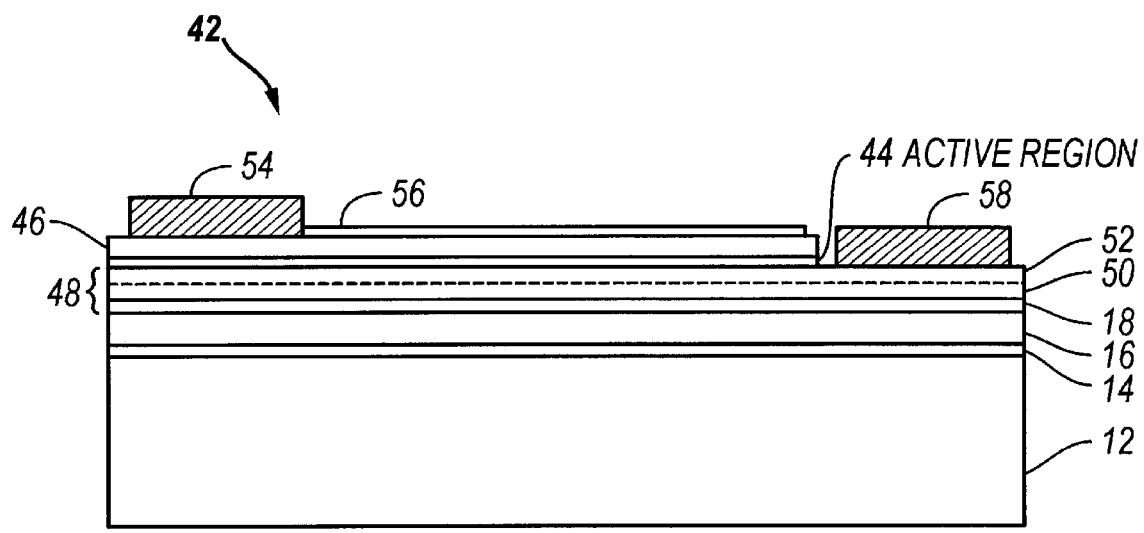
FIG. 6 is a schematic illustration of a light emitting diode in accordance with an embodiment of the present invention.
Figure 13:
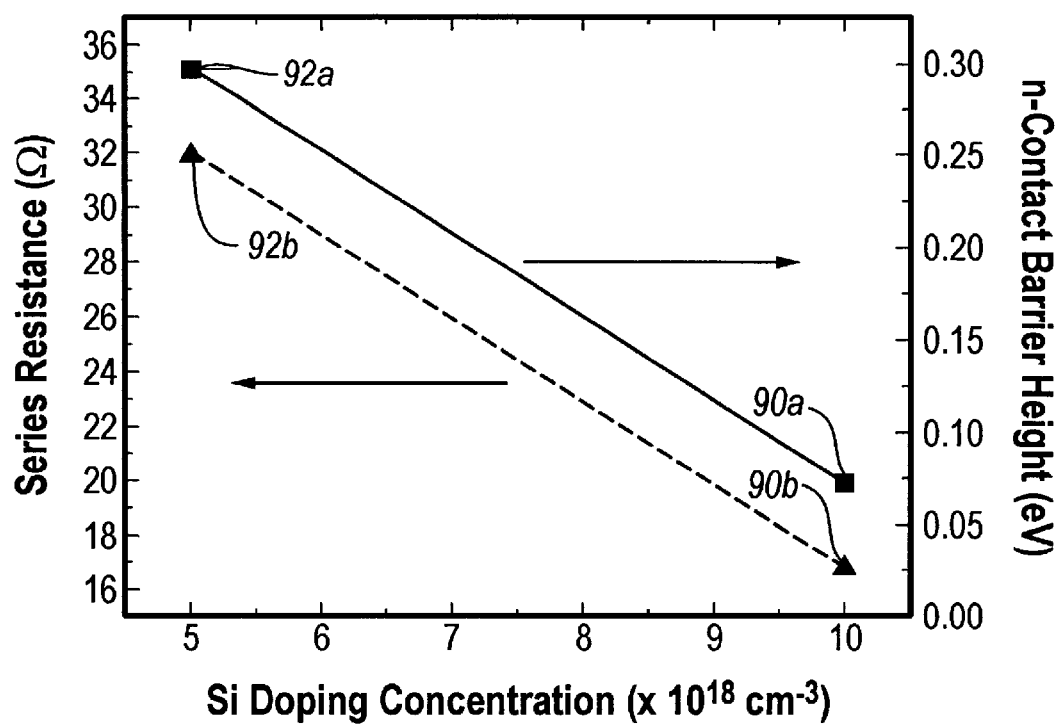
FIG. 13 is a plot of series resistance and n-contact barrier height versus Si doping concentration in an n-type GaN layer.

Advantageously, the highly silicon doped ($\geq$ about $10^{19}$ cm$^{-3}$) and thick ($\geq$ about 2 µm) n-type III-Nitride layer or layers in a light emitting device such as LED 42 in accordance with an embodiment of the present invention provide low series resistance between, for example, n-contact 58 and active region 44 (FIG. 6). Moreover, the n-contact barriers associated with these layers are lower than those typical of n-layers having lower silicon concentrations. The reduction of series resistance and n-contact barriers in light emitting diodes in accordance with the present invention is illustrated in FIG. 13, which plots series resistance and n-contact barrier height versus silicon doping concentration for ~2 µm thick n-type GaN layers. Data points 90*a* and 90*b* characterize a crack-free GaN layer grown in accordance with the present invention and having a Si concentration of about $1\times10^{19}$ cm$^{-3}$. Data points 92*a* and 92*b* characterize GaN layers having substantially lower Si concentrations. The low series resistance and low n-contact barriers of III-Nitride light emitting devices in accordance with the present invention contribute to a reduction of the required driving voltage for these devices.

Figure 7:
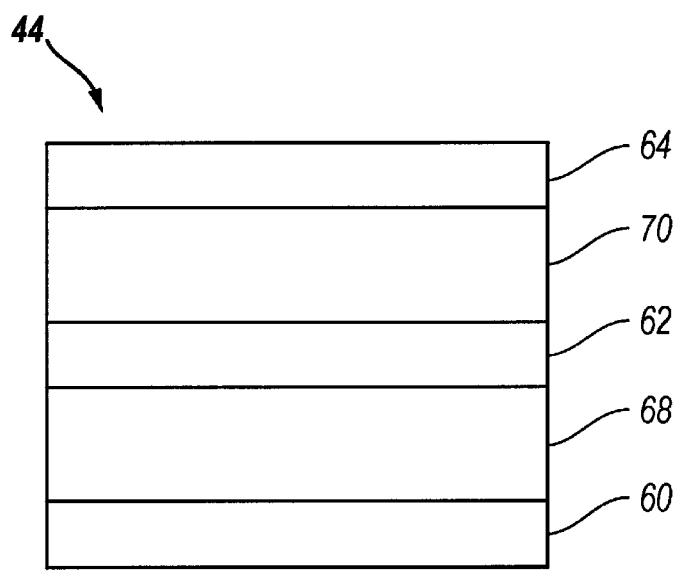
FIG. 7 is a schematic illustration of the active region of a light emitting diode in accordance with an embodiment of the present invention.

Referring to FIG. 7, in one embodiment active region 44 of LED 42 includes In$_x$Ga$_{1-x}$N quantum well layers 60, 62, and 64, and GaN barrier layers 68 and 70, with quantum well layer 60 located closest to substrate 12 (FIG. 6). Quantum well layers 60, 62, and 64 are about 10 Å to about 100 Å (typically about 25 Å) thick. Barrier layers 68 and 70 are about 25 Å to about 500 Å (typically about 125 Å) thick. Although FIG. 7 shows three quantum well layers and two barrier layers, other embodiments include either more or fewer such quantum well and barrier layers. In other embodiments the quantum well and barrier layers may be formed, for example, from semiconductor materials including but not limited to GaN, InGaN, AlGaN, AlInGaN, and combinations thereof. The quantum well layers may also be Si-doped.

The inventors have determined that the effect of energy barriers produced in the active region of a III-Nitride light emitting device by piezoelectric and spontaneous polarization induced charges in combination with heterojunction band offsets can be reduced by doping portions of the active region with donor and/or acceptor dopants. The donor and acceptor dopants provide stationary positive and negative charges, respectively, and reduce the net charges present at the heterointerfaces. In addition, the doping provides free charge carriers (electrons or holes) that accumulate at heterointerfaces in the active region (between barriers and wells, for example) and reduce the widths of the piezoelectric energy barriers.

Figure 8:
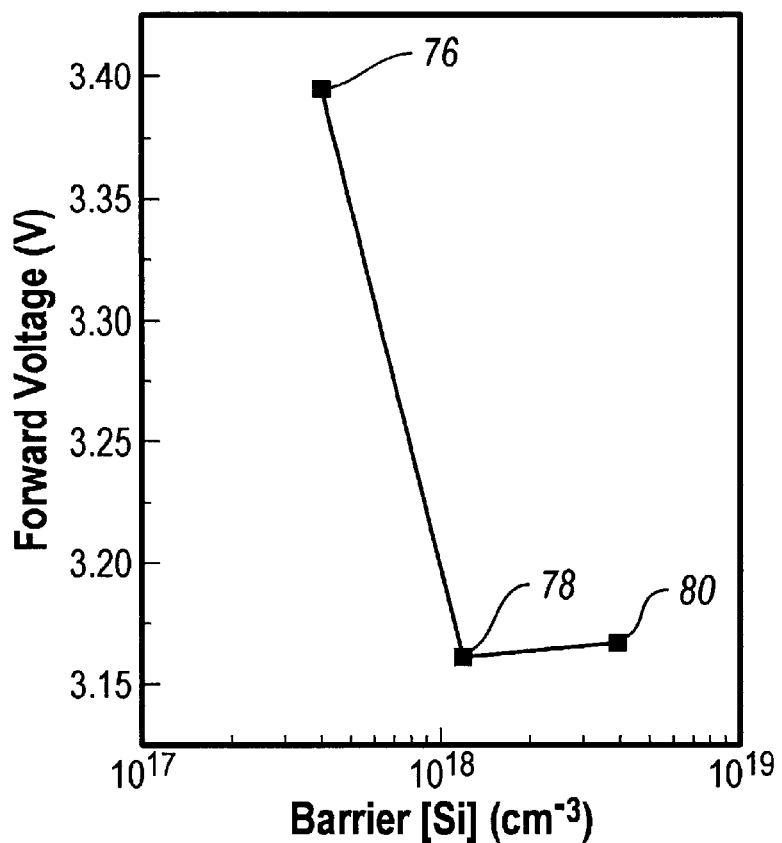
FIG. 8 is a plot of the driving voltage of light emitting diodes in accordance with embodiments of the present invention versus the silicon concentration in their active region barrier layers.

In one embodiment, for example, one or more of the GaN barrier layers in active region 44 are uniformly doped with silicon at a concentration greater than about $5\times10^{17}$ cm$^{-3}$. In some implementations portions of the barrier layers are doped with silicon at a concentration greater than about $1\times10^{19}$ cm$^{-3}$. Advantageously, the driving voltage of LED 42 is thereby reduced. Referring to FIG. 8, for example, data points 76, 78, and 80 indicate the forward driving voltage required at a forward current density of about 30 A/cm$^2$ for LEDs having silicon doped barrier layers in accordance with the present invention. The LEDs corresponding to data points 76, 78, and 80 each included three quantum wells and three barrier layers (all barrier layers silicon doped) and an n-type GaN layer (in region 48 of FIG. 6, for example) having a thickness of about 2 µm and a silicon concentration of about $10^{19}$ cm$^{-3}$.

Figure 14:
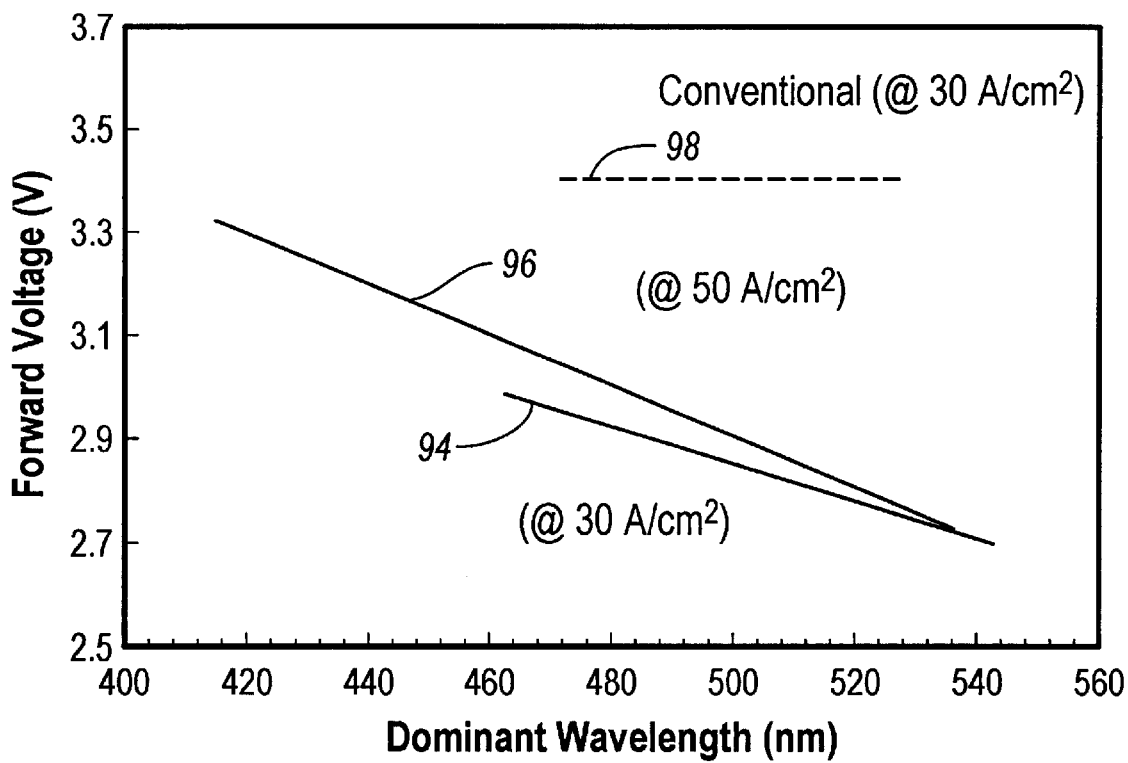
FIG. 14 is a plot of driving voltage versus dominant wavelength for conventional light emitting diodes and for light emitting diodes in accordance with embodiments of the present invention.

The performance of light emitting diodes having n-type GaN layers (~2 µm thick, Si concentration~$1\times10^{19}$ cm$^{-3}$) and Si doped barrier layers in accordance with the present invention is also characterized in FIG. 14, which plots driving voltage versus dominant wavelength. Lines 94 and 96 indicate the performance of such devices in accordance with the present invention at driving current densities of, respectively, about 30 A/cm$^2$ and about 50 A/cm$^2$. For comparison, line 98 indicates the performance of conventional light emitting diodes at a driving current density of about 30 A/cm$^2$. Clearly, the driving voltage for a III-Nitride light emitting diode in accordance with the present invention may be much less than that of a conventional III-Nitride light emitting diode that emits at about the same dominant wavelength.

The barrier layers may be advantageously uniformly doped with other donor impurities such as Ge, S, Se, Te, Sn, or O, for example, to similarly high concentrations in accordance with the present invention. Such other donor impurities may be used instead of or in addition to silicon. The barrier layers may also be advantageously uniformly doped with acceptor impurities such as, for example, Mg, Zn, Ca, Cd, C, and Be or combinations thereof.

In other embodiments, one or more of the GaN barrier layers is doped in a spatially non-uniform manner with donor and/or acceptor impurities. Non-uniform doping of a barrier layer is accomplished by varying the flow of the dopant precursor gas (silane, for example) during the growth of the barrier layer.

Figure 9:
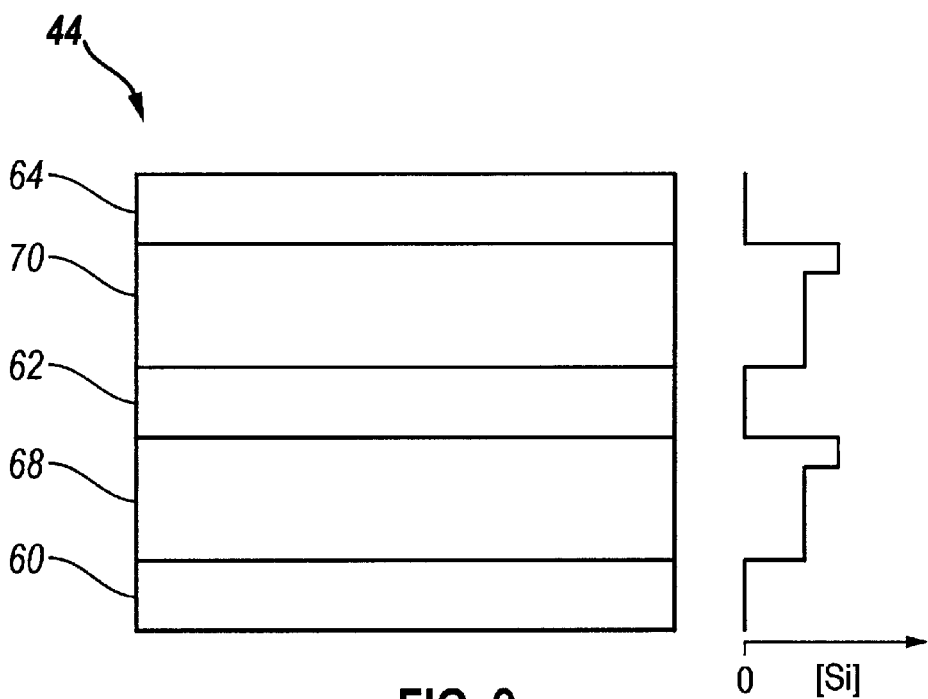
FIG. 9 schematically illustrates the silicon concentration profile in the active region of a light emitting diode in accordance with an embodiment of the present invention.

In the embodiment illustrated in FIG. 9, for example, the barrier layers are non-uniformly doped with silicon. In this embodiment the silicon concentration in each barrier layer is higher in a portion of the barrier layer away from the substrate (which is located below layer 60) than it is in the rest of the barrier layer. In particular, the silicon concentration profile in each barrier layer has a spike on the side of the barrier layer furthest from the substrate (the trailing edge). The regions of the barrier layers in which the concentration spikes occur have thicknesses of, for example, about 5 Å to about 100 Å, typically about 20 Å. The silicon concentration in the spike regions is, for example, greater than about $1 \times 10^{18}$ cm$^{-3}$. In some implementations the silicon concentrations in the spike regions is greater than about $1 \times 10^{19}$ cm$^{-3}$. The silicon concentration in the barriers outside of the spike regions is, for example, less than about $5 \times 10^{18}$ cm$^{-3}$.

Figure 10:
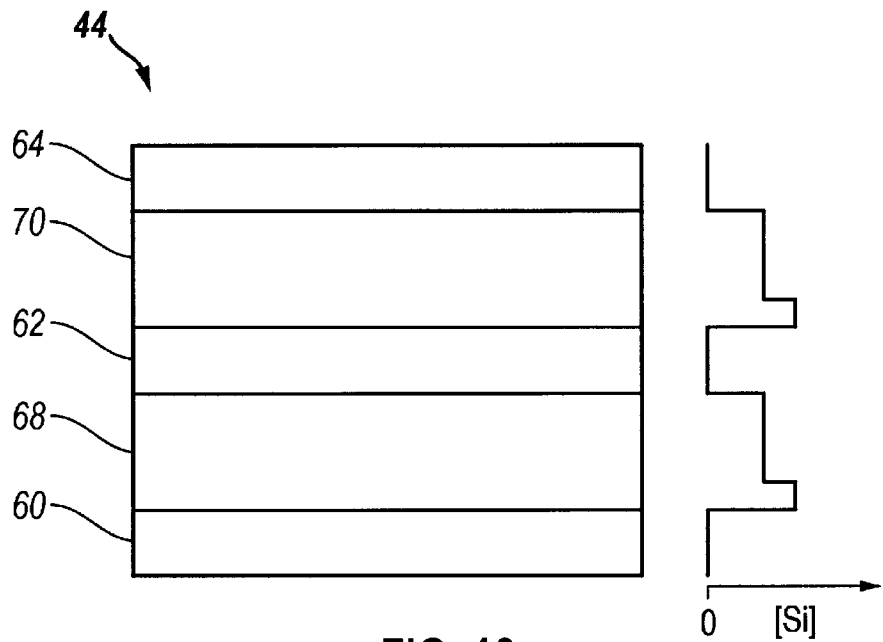
FIG. 10 schematically illustrates the silicon concentration profile in the active region of a light emitting diode in accordance with another embodiment of the present invention.

In the embodiment illustrated in FIG. 10, the silicon concentration in each barrier layer is higher in a portion of the barrier layer near the substrate than it is in the rest of the barrier layer. In particular, the silicon concentration profile in each barrier layer has a spike on the side of the barrier layer nearest the substrate (the leading edge). The silicon concentrations inside and outside the spike regions are, for example, as described for the embodiment illustrated in FIG. 9.

Spatially non-uniform dopant concentrations that vary in a barrier layer with distance in a direction substantially perpendicular to the substrate are referred to herein as graded concentration profiles. In addition to the concentration profiles illustrated in FIGS. 9 and 10, graded concentration profiles include, for example, concentration profiles that vary linearly through a barrier layer and concentration profiles including a spike located in a central portion of a barrier layer.

Figure 11:
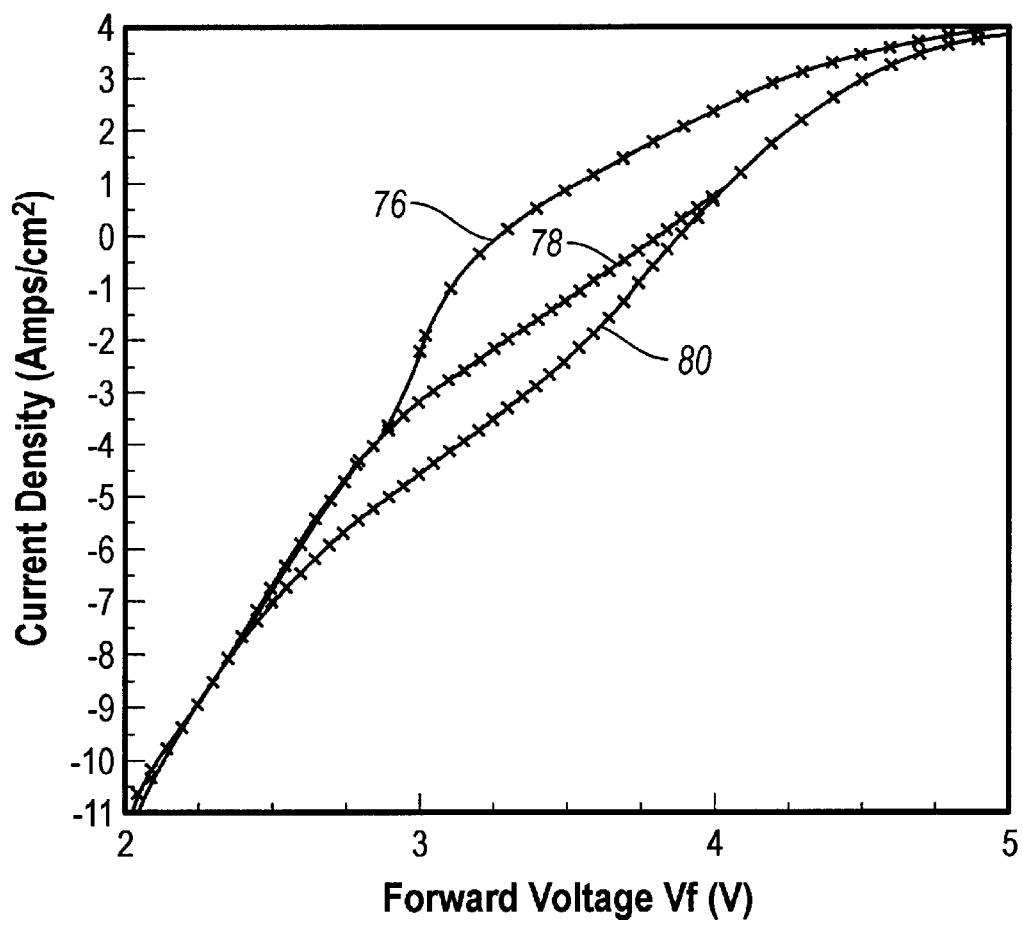
FIG. 11 is a plot of the current density versus driving voltage curves for light emitting diodes in accordance with several embodiments of the present invention.

FIG. 11 shows conventionally calculated current-voltage (I/V) characteristics for three LEDs in accordance with embodiments of the present invention. Curve 76 represents the I/V characteristics for an LED including trailing edge silicon concentration spikes of about $1 \times 10^{19}$ cm$^{-3}$ in barrier layers that are otherwise doped at a concentration of about $1 \times 10^{18}$ cm$^{-3}$. Curve 78 represents the I/V characteristics for an LED including leading edge silicon concentration spikes of about $1 \times 10^{19}$ cm$^{-3}$ in barrier layers that are otherwise doped at a concentration of about $1 \times 10^{18}$ cm$^{-3}$. Curve 80 represents the I/V characteristics for an LED including barrier layers uniformly doped with silicon at a concentration of about $1 \times 10^{18}$ cm$^{-3}$. The three I/V curves indicate that the driving voltage for the LEDs having silicon concentration spikes is generally lower than that for the LED having barrier layers uniformly doped with silicon. LEDs with uniformly doped barrier layers have a driving voltage lower than LEDs with undoped barrier layers.

Figure 12:
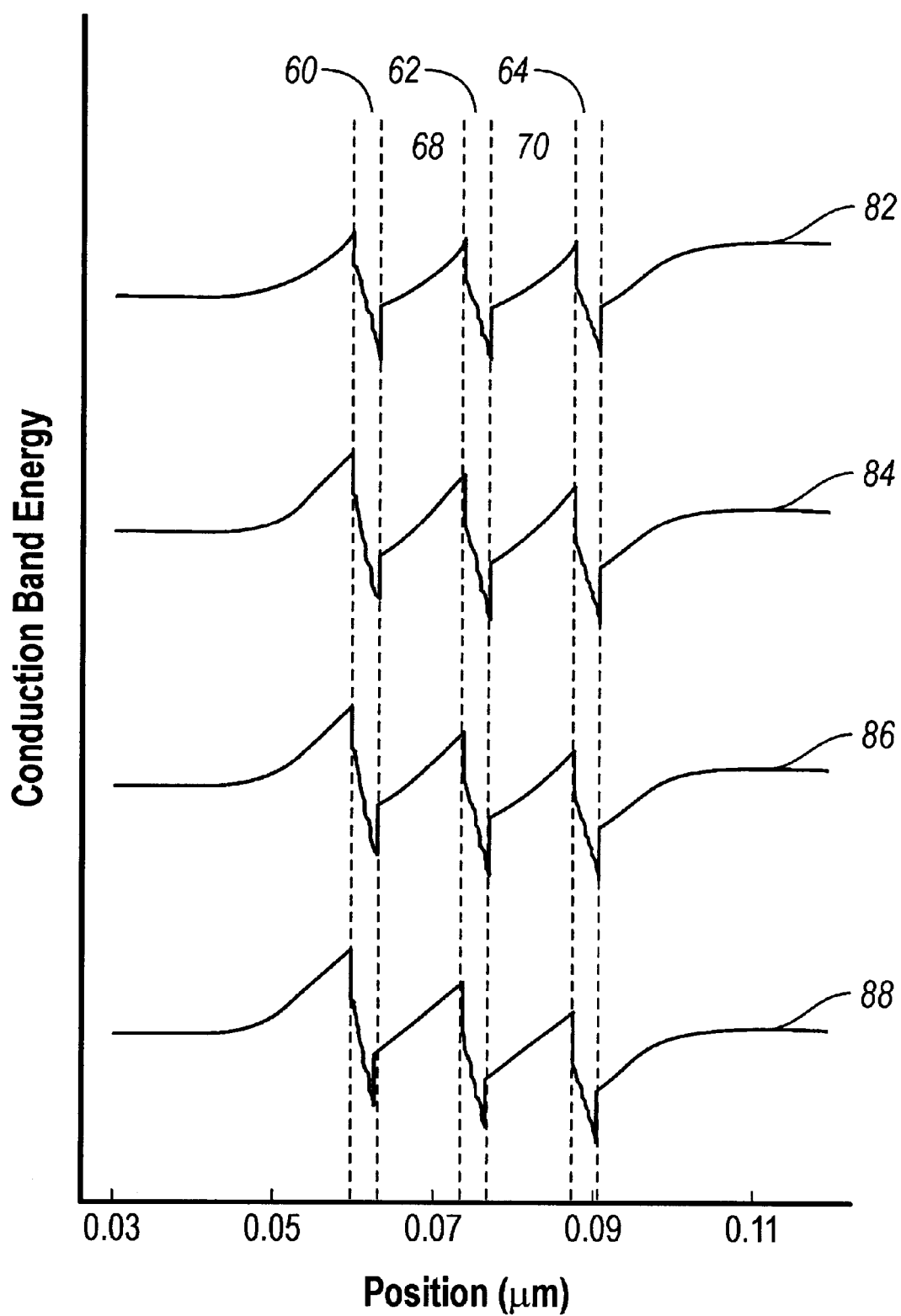
FIG. 12 is a plot of the conduction band edge energy versus position for light emitting diodes in accordance with several embodiments of the present invention.

FIG. 12 shows the conventionally calculated conduction band edge energy as a function of position in active region 44 for four LEDs in accordance with embodiments of the present invention. Curve 82 represents the conduction band edge for an LED including trailing edge silicon concentration spikes of about $1 \times 10^{19}$ cm$^{-3}$ in barrier layers that are otherwise doped at a concentration of about $1 \times 10^{18}$ cm$^{-3}$. Curve 84 represents the conduction band edge for an LED including leading edge silicon concentration spikes of about $1 \times 10^{19}$ cm$^{-3}$ in barrier layers that are otherwise doped at a concentration of about $1 \times 10^{18}$ cm$^{-3}$. Curve 86 represents the conduction band edge for an LED including barrier layers uniformly doped with silicon at a concentration of about $1 \times 10^{18}$ cm$^{-3}$. Curve 88 represents the conduction band edge for an LED having no doping in the barrier layers. The four conduction band edge curves illustrate that the band-bending in the active regions (due in part to spontaneous polarization and piezoelectric fields) is reduced by the presence of doping spikes. In particular, doping spikes at the trailing edges of the barriers layers are particularly effective at compensating for the piezoelectric fields.

In other embodiments, one or more of the barrier layers is non-uniformly doped with an acceptor impurity such as, for example, Mg, Zn, Ca, Cd, C, and Be or combinations thereof. The concentration profiles of the acceptor impurities may be, for example, similar to those shown for silicon in FIG. 9 and FIG. 10. The effect of a spike in an acceptor impurity concentration at the leading edge of a barrier layer is expected to be similar to that of a spike in a donor impurity concentration at the trailing edge of the barrier layer. Similarly, the effect of a spike in an acceptor impurity concentration at the trailing edge of a barrier layer is expected to be similar to that of a spike in a donor impurity concentration at the leading edge of the barrier layer. In some embodiments, barrier layers are non-uniformly doped with donor impurities and acceptor impurities.

Normally, barrier doping with both acceptor and donor impurities is expected to increase the driving voltage of the LED. However, in the case of a III-Nitride LED, the presence of piezoelectric fields in the barrier and quantum well layers causes an accumulation at the interfaces between the barrier and quantum well layers of spatially fixed sheets of charge with positive and negative signs. Because the charge of an ionized acceptor impurity is negative, if the acceptor impurities are incorporated into regions of the barrier layers that are near the fixed negative sheet charges induced by the piezoelectric field, then the driving voltage of the LED can be reduced. This reduction in driving voltage can occur if the remainder of the barrier layer is doped with donor impurities, either in a spatially uniform or non-uniform manner. This reduction in driving voltage can also occur if the remainder of the barrier layer is not doped with any impurity, or with a combination of donor and acceptor impurities. Improvements have been described for LEDs operating at current densities of 30–50 A/cm$^2$. Forward voltage reduction may be even more substantial for LEDs operating at current densities greater than or equal to about 100 A/cm$^2$ and LDs.

Doping of barrier layers in spatially uniform and spatially non-uniform manners as described above is also advantageous in embodiments that do not include a defect reduction structure and/or a highly silicon doped n-layer. Referring again to FIG. 6, for example, in such embodiments lower III-Nitride region 48 may be grown directly on nucleation layer 14.

Although in the illustrated embodiments the highly Si doped n-type III-Nitride layer is disposed between the active region and a substrate, in other embodiments the active region may be disposed between a substrate and a highly Si doped n-type III-Nitride layer.

While the present invention is illustrated with particular embodiments, the invention is intended to include all variations and modifications falling within the scope of the appended claims.

We claim:

1. A light emitting device comprising:
   a substrate;
   a nucleation layer disposed on said substrate;
   a defect reduction structure disposed above said nucleation layer; and
   an n-type III-Nitride semiconductor layer disposed above said defect reduction structure, said n-type layer having a thickness greater than or equal to about one micron and a silicon dopant concentration greater than or equal to about $1 \times 10^{19}$ cm$^{-3}$;
   wherein said defect reduction structure comprises a layer that reduces a threading dislocation density in said n-type layer to less than about $2 \times 10^9$ cm$^{-2}$.

2. The light emitting device of claim 1, wherein said substrate comprises one of sapphire, silicon carbide, and silicon.

3. The light emitting device of claim 1, wherein said nucleation layer comprises a material selected from gallium, indium, aluminum, nitrogen, and combinations thereof.

4. The light emitting device of claim 1, wherein said substrate comprises sapphire, said n-type layer comprises GaN, and said defect reduction structure reduces an "a" lattice parameter of said n-type layer to less than about 3.187 Angstroms.

5. The light emitting device of claim 1, wherein said defect reduction structure comprises a III-Nitride semiconductor layer on which is disposed a silicon containing material.

6. The light emitting device of claim 1, wherein said defect reduction structure comprises at least another nucleation layer.

7. The light emitting device of claim 1, wherein said n-type layer has a threading dislocation density of less than or equal to about $2 \times 10^9$ cm$^{-2}$.

8. The light emitting device of claim 1, wherein said n-type layer is grown directly on said defect reduction structure.

9. The light emitting device of claim 1, wherein said silicon dopant concentration is greater than or equal to $1 \times 10^{19}$ cm$^{-3}$.

10. The light emitting device of claim 1, wherein said n-type layer has a thickness greater than or equal to about 2 microns.

11. The light emitting device of claim 1, further comprising an active region that includes at least one barrier layer uniformly doped with an impurity at a concentration greater than or equal to about $5 \times 10^{17}$ cm$^{-3}$.

12. The light emitting device of claim 1, further comprising an active region that includes at least one barrier layer doped with an impurity having a concentration graded in a direction substantially perpendicular to said substrate.

13. The light emitting device of claim 1, further comprising an active region that includes at least one barrier layer doped with an impurity having a concentration graded to at least partially cancel an effect of a piezoelectric field in said active region.

14. The light emitting device of claim 1, further comprising an active region that includes at least one barrier layer doped with a donor impurity having a concentration greater than or equal to about $1 \times 10^{19}$ cm$^{-3}$ in a region of said barrier layer away from said substrate.

15. The light emitting device of claim 1, further comprising an active region that includes at least one barrier layer doped with an acceptor impurity in a region of said barrier layer near to said substrate.

16. The light emitting device of claim 1, further comprising an active region that includes at least one barrier layer doped with a donor impurity having a concentration greater than or equal to about $1 \times 10^{19}$ cm$^{-3}$ in a region of said barrier layer away from said substrate and that includes at least one barrier layer doped with an acceptor impurity in a region of said barrier layer near to said substrate.

17. A light emitting device comprising:
    a sapphire substrate;
    a nucleation layer disposed on said substrate;
    a III-Nitride semiconductor defect reduction layer disposed above said nucleation layer; and
    an n-type GaN layer disposed above said defect reduction layer, said n-type layer having a thickness greater than or equal to about $10^{19}$ cm$^{-3}$, and a dislocation density less than about $2 \times 10^9$ cm$^{-2}$.

18. The light emitting device of claim 17, wherein said N-type GaN layer has a lattice parameter less than about 3.187 Angstroms.

19. A light emitting device comprising;
    a III-Nitride semiconductor active region including at least one barrier layer, said barrier layer doped with an impurity having a concentration graded in a direction substantially perpendicular to said active region.

20. The light emitting device of claim 19, wherein said concentration of said impurity is graded to at least partially cancel an effect of a piezoelectric field in said active region.

21. The light emitting device of claim 19, wherein said impurity is a donor impurity.

22. The light emitting device of claim 19, wherein said impurity is silicon.

23. The light emitting device of claim 19, wherein said active region overlies a substrate, and wherein said impurity is a donor impurity having a concentration greater than about $1 \times 10^{19}$ cm$^{-3}$ in a region of said barrier layer away from said substrate.

24. The light emitting device of claim 19, wherein said impurity is an acceptor impurity.

25. The light emitting device of claim 19, wherein said impurity is Mg.

26. The light emitting device of claim 19, wherein said active region includes a first barrier layer doped with an acceptor impurity having a concentration graded in a direction substantially perpendicular to said active region and a second barrier layer doped with a donor impurity having a concentration graded in a direction substantially perpendicular to said active region.

27. The light emitting device of claim 19 wherein said barrier layer is doped with a donor impurity and an acceptor impurity, wherein at least one of the donor impurity and the acceptor impurity has a concentration graded in a direction substantially perpendicular to said active region.

28. The light emitting device of claim 19 wherein said barrier layer has a linear concentration profile.

* * * * *

UNITED STATES PATENT AND TRADEMARK OFFICE
CERTIFICATE OF CORRECTION

PATENT NO. : 6,630,692 B2 Page 1 of 1
DATED : October 7, 2003
INVENTOR(S) : Werner Goetz et al.

It is certified that error appears in the above-identified patent and that said Letters Patent is hereby corrected as shown below:

Column 14,
Line 24, after the words "or equal to about" please insert -- one micron, a silicon dopant concentration greater than or equal to about --.

Signed and Sealed this

Twenty-seventh Day of January, 2004

JON W. DUDAS
*Acting Director of the United States Patent and Trademark Office*